US009828546B2

(12) United States Patent
Kechele et al.

(10) Patent No.: US 9,828,546 B2
(45) Date of Patent: Nov. 28, 2017

(54) METHOD FOR PRODUCING A PULVERULENT PRECURSOR MATERIAL, PULVERULENT PRECURSOR MATERIAL, AND USE OF PULVERULENT PRECURSOR MATERIAL (71) Applicant: OSRAM Opto Semiconductors GmbH, Regensburg (DE)

(72) Inventors: Juliane Kechele, Stadtbergen (DE); Simon Dallmeir, Koenigsbrunn (DE); Sonja Tragl, Augsburg (DE); Daniel Bichler, Munich (DE); Bianca Pohl-Klein, Gilching (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 72 days.

(21) Appl. No.: 14/889,405

(22) PCT Filed: May 7, 2014

(86) PCT No.: PCT/EP2014/059361
§ 371 (c)(1),
(2) Date: Nov. 5, 2015

(87) PCT Pub. No.: WO2014/187669
PCT Pub. Date: Nov. 27, 2014

(65) Prior Publication Data
US 2016/0122636 A1 May 5, 2016

(30) Foreign Application Priority Data
May 23, 2013 (DE) .................. 10 2013 105 307

(51) Int. Cl.
C09K 11/77 (2006.01)
C04B 35/584 (2006.01)
C09K 11/08 (2006.01)
C01B 21/06 (2006.01)
H01L 33/50 (2010.01)

(52) U.S. Cl.
CPC ...... C09K 11/7734 (2013.01); C01B 21/0602 (2013.01); C01B 21/0605 (2013.01); C04B 35/584 (2013.01); C09K 11/0883 (2013.01); C09K 11/7728 (2013.01); C01P 2002/50 (2013.01); C01P 2002/52 (2013.01); C01P 2004/61 (2013.01); C01P 2004/62 (2013.01); C04B 2235/3224 (2013.01); C04B 2235/3852 (2013.01); C04B 2235/3873 (2013.01); C04B 2235/5409 (2013.01); C04B 2235/5436 (2013.01); C04B 2235/5463 (2013.01); C04B 2235/5481 (2013.01); H01L 33/502 (2013.01); H01L 2224/32245 (2013.01); H01L 2224/48091 (2013.01); H01L 2224/48247 (2013.01); H01L 2224/73265 (2013.01); H01L 2924/181 (2013.01)

(58) Field of Classification Search
CPC ............ C09K 11/7734; C09K 11/0883; C09K 11/7728; C01B 21/0602; C01B 21/0605; C04B 35/584; Y10T 428/2982
USPC ........................................................ 428/402
See application file for complete search history.

(56) References Cited

U.S. PATENT DOCUMENTS

| 5,518,808 | A | 5/1996 | Bruno et al. | |
|---|---|---|---|---|
| 5,643,674 | A | 7/1997 | Bruno et al. | |
| 7,521,862 | B2 | 4/2009 | Mueller et al. | |
| 8,093,798 | B2 * | 1/2012 | Becker | C09K 11/7734 252/301.4 R |
| 8,178,001 | B2 * | 5/2012 | Kaneda | C01B 33/20 252/301.4 F |
| 8,460,579 | B2 * | 6/2013 | Becker | C09K 11/0883 252/301.4 F |
| 9,023,240 | B2 | 5/2015 | Fujinaga et al. | |
| 9,062,252 | B2 * | 6/2015 | Hirosaki | C09K 11/0883 |
| 9,534,169 | B2 * | 1/2017 | Pohl-Klein | C04B 35/581 |

(Continued)

FOREIGN PATENT DOCUMENTS

CN 101044223 A 9/2007
CN 102791829 A 11/2012
(Continued)

OTHER PUBLICATIONS

Chen, C. et al.: "M2Si5N8:Eu2+-Based (M=Ca, Sr) Red-Emitting Phosphors Fabricated by Nitrate Reduction Process," Elsevier; Optical Materials, Sep. 2011, pp. 1585-1590, vol. 33, Issue 11.
Li, Y.Q. et al.: "Luminescence Properties of Red-Emitting M2Si5N8:Eu2+-Based (M=Ca, Sr, Ba) LED Conversion Phosphors," Elsevier; Journal of Alloys and Compounds, Sep. 2006, pp. 273-279, vol. 417.
"High-Purity Silicon Nitride Powder," UBE America Inc., Ceramics for Advanced Technology, Sep. 2009, 2 pages.
(Continued)

Primary Examiner — Leszek Kiliman
(74) Attorney, Agent, or Firm — Slater Matsil, LLP (57) ABSTRACT A method can be used for producing a powdery precursor material for an optoelectronic component having a first phase of the following general composition $(Ca_{1-a-b-c-d-e}Zn_dMg_eSr_cBa_bX_a)_2Si_5N_8$, wherein X is an activator that is selected from the group of the lanthanoids and wherein the following applies: $0<a<1$ and $0\leq b\leq 1$ and $0\leq c\leq$ and $0\leq d\leq 1$ and $0\leq e\leq 1$. The method includes producing a powdery mixture of starting materials. The starting materials comprise ions of the aforementioned composition. At least silicon nitride having a specific surface area greater than or equal to 9 m/g is selected as a starting material and wherein the silicon nitride comprises alpha silicon nitride or is amorphous. The method also includes heat-treating the mixture under a protective gas atmosphere.

19 Claims, 1 Drawing Sheet (56) References Cited

U.S. PATENT DOCUMENTS

| | | |
|---|---|---|
| 2003/0020101 A1 | 1/2003 | Bogner et al. |
| 2003/0052595 A1 | 3/2003 | Ellens et al. |
| 2003/0094893 A1 | 5/2003 | Ellens et al. |
| 2004/0234812 A1 | 11/2004 | Naito et al. |
| 2008/0001126 A1 | 1/2008 | Hirosaki |
| 2012/0037938 A1 | 2/2012 | Becker et al. |
| 2012/0228550 A1 | 9/2012 | Won et al. |
| 2014/0197362 A1* | 7/2014 | Sakata et al. ...... C09K 11/0883 252/301.4 F |
| 2014/0284649 A1 | 9/2014 | Baumgartner et al. |

FOREIGN PATENT DOCUMENTS

| | | |
|---|---|---|
| EP | 1806390 A1 | 7/2007 |
| EP | 2109651 B1 | 9/2011 |
| EP | 2412782 A1 | 2/2012 |
| JP | H08504871 A | 5/1996 |
| JP | H09249458 A | 9/1997 |
| JP | 2001318604 A | 11/2001 |
| JP | 2002055637 A | 2/2002 |
| JP | 2003138253 A | 5/2003 |
| JP | 2003515655 A | 5/2003 |
| JP | 2003203504 A | 7/2003 |
| JP | 2003206481 A | 7/2003 |
| JP | 2004347980 A | 12/2004 |
| JP | 2006089547 A | 4/2006 |
| JP | 2010510650 A | 4/2010 |
| JP | 2012509373 A | 4/2012 |
| JP | 2012207143 A | 10/2012 |
| JP | 2014529912 A | 11/2014 |
| WO | 9414920 A1 | 7/1994 |
| WO | 2011149156 A1 | 12/2011 |
| WO | 2012017949 A1 | 2/2012 |
| WO | 2013053601 A2 | 4/2013 |

OTHER PUBLICATIONS

Li, Y.Q., et al., "The effect of replacement of Sr by Ca on the structural and luminescence properties of the red-emitting $Sr_2Si_5N_8:Eu^{2+}$ LED conversion phosphor," Journal of Solid State Chemistry, vol. 181, Dec. 15, 2007, pp. 515-524.

Lyckfeldt, O., et al., "Protein forming—a novel shaping technique for ceramics," Journal of the European Ceramic Society, vol. 20, Dec. 2000, pp. 2551-2559.

Van Den Eeckhout, K., et al.,"Luminescent Afterglow Behavior in the $M_2Si_5N_8$: Eu Family (M=Ca, Sr, Ba)," Materials, vol. 4, Issue 6, May 2011, pp. 980-990.

Watanabe, H., et al., "Crystal structure and luminescence of $Sr0.99Eu0.01AlSiN_3$," Journal Solid State Chemistry, vol. 181, May 3, 2008, pp. 1848-1852.

Xie, R., et al., "A Simple, Efficient Synthetic Route to $Sr_2Si_5N_8:Eu^{2+}$-Based Red Phosphors for White Light-Emitting Diodes," Chemistry of Materials, vol. 18, No. 23, Oct. 19, 2006, pp. 5578-5583.

\* cited by examiner

METHOD FOR PRODUCING A PULVERULENT PRECURSOR MATERIAL, PULVERULENT PRECURSOR MATERIAL, AND USE OF PULVERULENT PRECURSOR MATERIAL

This patent application is a national phase filing under section 371 of PCT/EP2014/059361, filed May 7, 2014, which claims the priority of German patent application 10 2013 105 307.6, filed May 23, 2013, each of which is incorporated herein by reference in its entirety.

TECHNICAL FIELD

The invention relates to a process for producing a pulverulent precursor material for an optoelectronic component, to a pulverulent precursor material and to the use of the pulverulent precursor material in an optoelectronic component.

BACKGROUND

In optoelectronic components, for example, light-emitting diodes (LEDs), ceramic materials or ceramic luminophores are used, which convert radiation emitted by a radiation source at a first wavelength to a radiation having a second wavelength. One feature of the ceramic materials is a high thermal durability because of their good removal of heat. A ceramic material or luminophore requires a particularly finely divided and reactive precursor material having a high sintering capacity, in order to be able to subject it easily to ceramic processes such as tape casting or spark plasma sintering (SPS). The reactive precursor material can be used in an optoelectronic component in powder or ceramic form.

SUMMARY

Embodiments of the invention specify an improved process for producing a pulverulent precursor material. Further embodiments specify a pulverulent precursor material and the use thereof.

BRIEF DESCRIPTION OF THE DRAWINGS

Further advantages and advantageous embodiments of the method, the pulverulent precursor material and the use thereof will become apparent from the working examples and FIGURE which follows.

DETAILED DESCRIPTION OF ILLUSTRATIVE EMBODIMENTS

According to at least one embodiment, a process for producing a pulverulent precursor material for an optoelectronic component is specified, wherein the pulverulent precursor material has a first phase of the following general composition:

$(Ca_{1-a-b-c-d-e}Zn_dMg_eSr_cBa_bX_a)_2Si_5N_8$ wherein X is an activator selected from the group of the lanthanoids,
wherein: $0<a<1$ and $0 \leq b \leq 1$ and $0 \leq c \leq 1$ and $0 \leq d \leq 1$ and $0 \leq e \leq 1$, having the process steps of:
A) producing a pulverulent mixture of reactants, wherein the reactants comprise ions of the abovementioned composition,
wherein at least silicon nitride having a specific surface area of greater or equal than 9 m²/g is selected as reactant, wherein the silicon nitride comprises alpha-silicon nitride or is amorphous, and
B) calcining the mixture under a protective gas atmosphere.

X acts here as activator or dopant. The activator can be incorporated here into the crystal lattice, for example, in place of the cations Ca, Sr, Ba, Zn, Mn and/or Mg in the pulverulent precursor material of the abovementioned general composition of the first phase. The activator may include one or more elements from the group of the lanthanoids. The activator may be selected from a group comprising lanthanum, cerium, praseodymium, neodymium, promethium, samarium, europium, gadolinium, terbium, dysprosium, holmium, erbium, thulium, ytterbium and lutetium. The activation is especially europium, cerium and/or lanthanum. The concentration of the activator in the pulverulent precursor material may be 0.01 to 20 mol %, especially 0.1 to 5 mol %, for example, 2.5 mol %.

A protective gas atmosphere may be understood, for example, to mean an inert or reducing atmosphere. This atmosphere has a reducing effect on the reactants, for example, and thus prevents the oxidation thereof. A reducing atmosphere does not rule out the presence of oxygen in this reducing atmosphere.

A first phase may be understood to mean a spatial region in which particular physical parameters such as density or refractive index and the chemical composition of the first phase are homogeneous. This means that the first phase has a constant and homogeneous chemical composition of the general formula $(Ca_{1-a-b-c-d-e}Zn_dMg_eSr_cBa_bX_a)_2Si_5N_8$.

The same applies correspondingly to a second phase having a chemical composition $(Ca_{1-x-y}Sr_yBa_x)Si_7N_{10}$ with $0 \leq x \leq 1$ and $0 \leq y \leq 1$. A second phase here and hereinafter may especially comprise or consist of $BaSi_7N_{10}$.

The calcined mixture, after grinding, may yet be sieved if required.

The abovementioned process can be used to produce particularly finely divided pulverulent precursor materials. Through the choice of suitable synthesis parameters and reactants, it is possible to influence the particle size or the grain size or agglomeration size or the particle size value of the resulting pulverulent precursor material. In this context, a particular role is played by the reactivity of the reactants, for example, of the nitrides used.

In process step A), silicon nitride ($Si_3N_4$) is selected or used as at least one nitride. A crucial parameter for the reactivity of such nitrides is the specific surface area thereof. The specific surface area here means the surface area of the material per unit weight. The specific surface area can be determined, for example, by gas adsorption (BET analysis).

The specific surface area of the nitrides used, especially of silicon nitride, is greater or equal than 9 m²/g. According to at least one embodiment, the specific surface area of at least one nitride, for example, of silicon nitride, is selected from the range from 9 m²/g to 150 m²/g, especially from the range from 10 m²/g to 110 m²/g, for example, 11 m²/g. The more reactive the nitride(s) used is/are, the more finely divided the precursor material produced will be. In the case of an excessively high specific surface area, for example, of greater than 150 m²/g, there is the risk that the resulting pulverulent precursor materials will become coarse-grained and sinter excessively. Moreover, there is the risk of oxidic contamination as a result of the increased reactivity of the surface.

Silicon nitride has crystalline and amorphous polymorphs. A polymorph is understood here and hereinafter to mean the propensity of a substance to exist in various manifestations. The polymorphs of silicon nitride exhibit the same atomic composition and/or have the same ratios of Si to N, but differ in terms of the spatial arrangement of their atoms and the structure, and hence exhibit different properties. The different lattice structures of silicon nitride can form as a result of influences such as pressure and/or temperature. Silicon nitride exists in three crystalline polymorphs: alpha-silicon nitride ($\alpha$-$Si_3N_4$), beta-silicon nitride ($\beta$-$Si_3N_4$) and gamma-silicon nitride ($\gamma$-$Si_3N_4$).

According to at least one embodiment, the reactants used are silicon nitride having a proportion of the alpha-silicon nitride polymorph of greater or equal than 90%, especially greater or equal than 95%, for example, 99%. More particularly, a reactant to be avoided is a silicon nitride having more than 10% by weight (or %) of beta-silicon nitride. A proportion of % by weight here means a proportion defined by the ratio of the proportion by mass to the total mass.

The silicon nitride may be amorphous in one embodiment. This means here that the atoms of the silicon nitride do not form ordered structures but form an irregular pattern. Amorphous silicon nitride therefore has only short-range order, but no long-range order.

In contrast to a coarse-grained precursor material, a finely distributed and/or pulverulent precursor material means here that the precursor material has a low first particle size value $d_{10}$ and/or a low second particle size value $d_{50}$ and/or a low third particle size value $d_{90}$. More particularly, the first particle size value $d_{10}$ has a value of less than 1 µm. The second particle size value $d_{50}$ especially has a value of less than 5 µm. The third particle size value $d_{90}$ especially has a value of less than 20 µm.

The first particle size value $d_{10}$ is understood hereinafter, unless stated otherwise, to mean the value $d_{10}$ which is defined in such a way that 10% of the material based on the proportion by volume is below and/or 90% of the material based on the proportion by volume is above this size or this diameter. The second particle size value $d_{50}$ is understood hereinafter, unless stated otherwise, to mean the value $d_{50}$ which is defined in such a way that 50% of the material based on the proportion by volume is below and/or 50% of the material based on the proportion by volume is above this size or this diameter. The third particle size value $d_{90}$ is understood hereinafter, unless stated otherwise, to mean that 90% of the material based on the proportion by volume is below and/or 10% of the material based on the proportion by volume is above this size or this diameter. The term particle size and/or particle size value in this connection can mean the primary particle size of a single grain. Alternatively, the term particle size and/or particle size value can also encompass the agglomerated particle size. The first, second and third particle size can be determined, for example, by means of laser diffraction. The $d_{10}$, $d_{50}$ and $d_{90}$ values describe a particle size distribution. The giving parameters or diameters of the particles are equivalent diameters of a sphere having equal scattering capacity.

According to at least one embodiment, in process step A), the reactants may be weighed in in stoichiometric amounts. "Stoichiometric" means that the ions of the reactants are used in accordance with their proportions in the target compound—here the composition of the first phase. Alternatively, the reactants can also be weighed in in non-stoichiometric amounts, in which case at least one reactant or a starting substance can be weighed in in excess, in order to compensate for any evaporation losses during the production. For example, reactants comprising alkaline earth metal components or alkaline earth metal cations can be weighed in in excess.

According to at least one embodiment, in process step A), the reactants used are carbonates, oxides, nitrides, carbides, metals and/or halides.

In this case, alkaline earth metal compounds and/or zinc compounds may be selected from alloy, hydrides, silicides, nitrides, halides, oxides, amides, amines, carbonates, metals and mixtures of these compounds and/or metals. Preference is given to using calcium nitride, strontium nitride and/or barium nitride.

A silicon compound may be selected from silicon nitrides, alkaline earth metal silicides, silicon diimides, silicon hydrides, silicon oxide, Si semimetal or mixtures of these compounds and/or of Si semimetal. Preference is given to using silicon nitride, which is stable, readily available and inexpensive. Silicon nitride may be present in a reactant mixture.

Compounds from the group of the lanthanoids, for example, compounds of europium, may be selected from oxides, nitrides, halides, hydrides, metals or mixtures of these compounds and/or metals. Preference is given to using europium oxide, which is stable, readily available and inexpensive.

According to at least one embodiment, alkaline earth metal cations present in the first phase in process step A), based on the total proportion of all cations in the first phase, are added in an excess of not more than 1 mol %, wherein a second phase is produced in addition to the first phase in or after process step B). The second phase has the following general composition: $(Ca_{1-x-y}Sr_yBa_x)Si_7N_{10}$ with $0 \leq x \leq 1$ and $0 \leq y \leq 1$. More particularly, the second phase has the general composition: $BaSi_7N_{10}$.

Alkaline earth metal cation here particularly means a divalent ion of calcium and/or strontium and/or barium. Alkaline earth metal cation may, however, mean a divalent ion of magnesium and/or zinc. The term "alkaline earth metal cation" thus additionally includes cations of transition group elements such as zinc.

More particularly, there is additional formation of a second phase $(Ca_{1-x-y}Sr_yBa_x)Si_7N_{10}$ with $0 \leq x \leq 1$ and $0 \leq y \leq 1$, especially $BaSi_7N_{10}$, when the alkaline earth metal cations comprise or consist of barium.

$(Ca_{1-x-y}Sr_yBa_x)Si_7N_{10}$ with $0 \leq x \leq 1$ and $0 \leq y \leq 1$, especially $BaSi_7N_{10}$, may serve as sintering aid for production of a ceramic material from this precursor material. In addition, the scattering propensity of the resulting ceramic can also be influenced by $BaSi_7N_{10}$. As a result, subsequent mixing of the pulverulent precursor material with $(Ca_{1-x-y}Sr_yBa_x)Si_7N_{10}$ with $0 \leq x \leq 1$ and $0 \leq y \leq 1$, especially $BaSi_7N_{10}$, as sintering aid is not required or can be avoided, since it is already present in homogeneous distribution in the product. The controlled formation of $(Ca_{1-x-y}Sr_yBa_x)Si_7N_{10}$ with $0 \leq x \leq 1$ and $0 \leq y \leq 1$, especially $BaSi_7N_{10}$, as sintering aid offers the advantage of homogeneous distribution of the two phases without having to conduct an additional mixing step. This means less energy input into the powder, saving of operating steps and saving of time. More particularly, the proportion of $(Ca_{1-x-y}Sr_yBa_x)Si_7N_{10}$ with $0 \leq x \leq 1$ and $0 \leq y \leq 1$, especially $BaSi_7N_{10}$, present as second phase in the pulverulent precursor material is $\leq 10\%$ (by weight), especially $\leq 8\%$, for example, 5%.

In the process described here, in the case of barium-containing reactants, it is possible, via the setting of the synthesis parameters in the product, to control the proportion of $(Ca_{1-x-y}Sr_yBa_x)Si_7N_{10}$ with $0 \leq x \leq 1$ and $0 \leq y \leq 1$, especially $BaSi_7N_{10}$, which acts as sintering additive in the precursor material. The formation of the $(Ca_{1-x-y}Sr_yBa_x)Si_7N_{10}$ with $0 \leq x \leq 1$ and $0 \leq y \leq 1$, especially $BaSi_7N_{10}$, can be controlled via the alkaline earth metal cation excess. If the alkaline earth metal cation excess is $\leq 1$ mol % based on the total proportion of all the cations, the result in the case of barium-containing reactants is $(Ca_{1-x-y}Sr_yBa_x)Si_7N_{10}$ with $0 \leq x \leq 1$ and $0 \leq y \leq 1$, especially $BaSi_7N_{10}$, as second phase or secondary phase. This can be explained by partial evaporation or breakdown of the alkaline earth metal cations or alkaline earth metal nitrides during the synthesis, which results in a deficiency of alkaline earth metal nitrides. This is compensated for by the formation of the $(Ca_{1-x-y}Sr_yBa_x)Si_7N_{10}$ with $0 \leq x \leq 1$ and $0 \leq y \leq 1$, especially $BaSi_7N_{10}$.

According to at least one embodiment, alkaline earth metal cations are added as ions in process step A), based on the composition of the first phase, in a stoichiometric proportion or in an excess of greater or equal than 1 mol %, based on the total proportion of all the cations in the first phase, wherein the first phase is obtained exclusively in or after process step B). If the proportion of the alkaline earth metal cation excess is greater or equal than 1 mol %, the formation of $(Ca_{1-x-y}Sr_yBa_x)Si_7N_{10}$ with $0 \leq x \leq 1$ and $0 \leq y \leq 1$, especially $BaSi_7N_{10}$, can be suppressed. Thus, only the first phase is formed.

The bulk density of the reactants affects the particle size of the product. In process step A), it should especially be ensured that the bulk density of the reactants is low. The more compressed the pulverulent mixture of the reactants in process step A) is, the more coarse-grained the resulting pulverulent precursor material will be. A low bulk density, in contrast, leads to a finely distributed precursor material. A low bulk density can especially be produced by loose mixing and/or sieving of the reactants without densifying them in process step A). If calcination is effected more than once in process step B), the bulk density can be reduced by loosening the calcined cake after the respective calcinations.

According to at least one embodiment, at least one flux is additionally added in process step A). Alternatively, it is also possible to dispense with a flux in process step A). The flux can be used for the improvement of crystallinity and for promotion of crystal growth of the pulverulent precursor material. Secondly, the addition of the flux can lower the reaction temperature or calcination temperature. The reactants can be homogenized with the flux. The homogenization can be effected, for example, in a mortar mill, a ball mill, a turbulent mixer or a plowshare mixer, or by means of other suitable methods. The flux can also be added only in further calcinations.

In the process, process step B) can be conducted at least once. More particularly, process step B) can be conducted once to five times, especially once to three times, for example, twice. The number of calcinations with subsequent grinding and optionally sieving in each case can affect the particle size or grain size or grain size value of the resulting precursor material. After the last calcination conducted, the mixture is ground and/or sieved.

According to at least one embodiment, the mixture is ground and/or loosened up and/or sieved between the individual calcining steps and/or before the calcining in process step B). This results in increasing loosening of the mixture, such that the grains are present in very loose form and/or with low agglomeration levels, and a fine pulverulent precursor material can be produced.

According to at least one embodiment, the calcining in process step B) in the process is conducted at a temperature selected from the range from 1200° C. to 1700° C. or 1200° C. to 1600° C. More particularly, process step B) is conducted at a temperature between 1200 and 1500° C., for example, 1450° C. If the reactant mixture contains a large amount of calcium, the calcining in process step B) can be effected at a temperature greater than 1000° C. If alkaline earth metal cations come exclusively from barium-containing reactants, the calcining in process step B) can be conducted at a temperature between 1350° C. and 1600° C. The selection of the temperature can affect the grain size or grain size value of the resulting pulverulent precursor material. The temperature refers here to the maximum temperature or the maximum synthesis temperature in process step B). The synthesis temperature chosen in this process may be lower than those temperatures in conventional processes. The use of lower temperatures in process step B) leads to improved sintering capacity when the pulverulent precursor material is processed further.

According to at least one embodiment, a hold time selected from the range from one minute to 24 hours is selected during the calcining in process step B). More particularly, the hold time is selected from the range of 30 minutes to eight hours, for example, from the range of two hours to six hours, for example, two hours. "Hold time" is understood to mean the time during which the maximum temperature is maintained. Together with the heating and cooling time, the hold time gives the total calcining time. The hold time can likewise affect the particle size of the resulting pulverulent precursor material.

A further parameter for affecting the particle size of the resulting pulverulent precursor material is the heating and cooling ramps. These may be selected, for example, according to the furnace type. One furnace type is, for example, a tubular furnace, a chamber furnace or a push-through furnace.

The calcination can be effected in a crucible, for example, made from tungsten, molybdenum, corundum, aluminum oxide (sapphire), graphite or boron nitride. This crucible may have a lining, for example, of molybdenum, or a lining of sapphire. The calcining can be effected in a gas-tight furnace under a reducing atmosphere and/or inert gas, for example, in hydrogen, ammonia, argon, nitrogen or mixtures thereof. The atmosphere may be flowing or stationary. It may additionally be advantageous for the quality of the resulting precursor material when elemental carbon in finely distributed form is present in the furnace space. Alternatively, it is possible to add carbon directly to the mixture of the reactants.

Multiple calcining of the reactants with or without an intermediate reprocessing operation, for example, grinding and/or sieving, can further improve the crystallinity or grain size distribution. Further advantages may be a lower defect density combined with improved optical properties of the resulting precursor material and/or a higher stability of the resulting precursor material.

According to at least one embodiment, process step B) is followed by a process step C). In process step C), the pulverulent precursor material can be ground. Grinding can be effected, for example, in a ball mill (wet or dry), in a fluidized bed mill or in a mortar mill with a grinding time of 1 minute to four hours.

According to at least one embodiment, process step C) is followed or preceded by a process step D). In process D), the pulverulent precursor material can be washed in alkali and/or acid. The acid may be selected, for example, from a group comprising hydrochloric acid, sulfuric acid, nitric acid, hydrofluoric acid, organic acids and mixtures thereof. The alkali may be selected from a group comprising, for example, potassium hydroxide solution, sodium hydroxide solution and mixtures thereof. Such washes can increase the efficiency when a doped pulverulent precursor material is being produced. In addition, secondary phases, glass phases or other impurities can be removed thereby, and an improvement in the optical properties of the pulverulent precursor material can be achieved.

Further specified is a pulverulent precursor material produced by a process according to the details above.

According to at least one embodiment, the pulverulent precursor material has a first particle size value $d_{10}$ and/or a second particle size value $d_{50}$ and/or a third particle size value $d_{90}$. The first particle size value $d_{10}$ is less than 1 μm, especially less than 0.5 μm, for example, 0.2 or 0.3 μm. The second particle size value $d_{50}$ is less than 5 μm, especially less than 2 μm, for example, 0.9 or 1 μm. The third particle size value $d_{90}$ is less than 20 μm, especially less than 15 μm, for example, between 3.9 and 6.7 μm, for example, 2.4 μm.

The process thus provides a particularly finely distributed or finely divided pulverulent precursor material having a very small first particle size value $d_{10}$ and also a second particle size value $d_{50}$ and also a third particle size value $d_{90}$. The finely distributed pulverulent precursor material is suitable for use in optoelectronic components, for example, light-emitting diodes. This includes both the use of the precursor in the form of powder as pulverulent conversion material and the further processing of the precursor to give ceramic luminophore converters or the use thereof in optoelectronic components. The latter is accounted for particularly by the good sinterability of the finely distributed pulverulent precursor material.

Additionally specified is the use of the pulverulent precursor material for formation of at least one ceramic layer of an optoelectronic component. The optoelectronic component may comprise, for example, an LED.

According to at least one embodiment, the pulverulent precursor material may be used in powder form, for example, embedded in silicone, in the beam path of an optoelectronic component.

According to at least one embodiment, the pulverulent precursor material constitutes a starting material for the production of a ceramic layer of an optoelectronic component, the ceramic layer being intended for disposal in the beam path of the optoelectronic component having a semiconductor layer sequence.

According to at least one embodiment, at least one additional luminophore or an additional precursor material is disposed in the beam path of the optoelectronic component for production of white light.

According to at least one embodiment, the pulverulent precursor material in an optoelectronic component takes the form of a powder, in which case the powder, for example, embedded in silicone, is disposed in the beam path of the optoelectronic component having a semiconductor layer sequence.

According to this embodiment, the semiconductor materials that occur in the semiconductor layer sequence are unrestricted, provided that at least some are electroluminescent. Examples of compounds used are those composed of the elements selected from indium, gallium, aluminum, nitrogen, phosphorus, arsenic, oxygen, silicon, carbon and combinations thereof. However, it is also possible to use other elements and additives. The layer sequence having an active region may be based, for example, on nitride compound semiconductor materials. "Based on nitride compound semiconductor materials" in the present connection means that the semiconductor layer sequence or at least a portion thereof includes or consists of a nitride compound semiconductor material, preferably $Al_nGa_mIn_{1-n-m}N$ with $0 \leq n \leq 1$, $0 \leq m \leq 1$ and $n+m \leq 1$. This material need not necessarily have a mathematically exact composition according to the above formula. Instead, it may, for example, have one or more dopants and additional constituents. For the sake of simplicity, however, the above formula includes only the essential constituents of the crystal lattice (Al, Ga, In, N), even though they may be partly replaced and/or supplemented by small amounts of further substances.

The semiconductor layer sequence may have, as active region, for example, a conventional pn junction, a double heterostructure, a single quantum well structure (SQW structure) or a multiple quantum well structure (MQW structure). The semiconductor layer sequence may, as well as the active region, comprise further functional layers and functional regions, for instance p- or n-doped charge carrier transport layers, i.e. electron or hole transport layers, p- or n-doped confinement or cladding layers, buffer layers and/or electrodes, and combinations thereof. Such structures relating to the active region or the further functional layers and regions are known to those skilled in the art, especially in terms of composition, function and structure and will therefore not be elucidated in detail here.

The pulverulent precursor material may form the entirety of the ceramic layer. Alternatively, further additions not including the pulverulent precursor material may be present in the ceramic layer. The pulverulent precursor material may be processed further to give a ceramic or a ceramic layer. The ceramic processing can be effected, for example, by spark plasma sintering (SPS) or tape casting or hot pressing or hot isostatic pressing (HIP), optionally followed by sintering.

According to at least one embodiment, the pulverulent precursor material comprises or consists of the first phase and the second phase. The second phase may serve as sintering aid for formation of the ceramic layer. This exhibits the advantage that the second phase is produced in situ and as a result need not be mixed in additionally, in order to produce the ceramic layer. This saves a further mixing step, time and operating steps. In addition, this means less energy input to the pulverulent precursor material.

According to at least one embodiment, the ceramic layer is used as wavelength conversion layer. The wavelength conversion layer may be present in a light-emitting diode, for example, a full conversion diode. In the wavelength conversion layer, it is thus possible to use a pulverulent precursor material which is a luminophore precursor and has a low particle size and hence good sinterability. Use in a wavelength conversion layer can be effected in powder form or in the form of further-processed ceramic. In both cases, the wavelength conversion layer can be disposed in the beam path of the light-emitting diode and convert primary radiation emitted partly or fully to a secondary radiation having a different wavelength, usually a longer wavelength.

The wavelength conversion layer can be produced by the customary ceramic production methods as specified in connection with the pulverulent precursor material. In order to achieve a small particle or agglomerate size of the pulverulent precursor material, as required for the ceramic production process, it would be necessary to grind coarse-grain powders to a comparatively high degree. One effect of this, however, is a poorer efficiency of the materials because of lattice defects and impurities which are introduced into the grinding material as a result of the long grinding process. This results in a low quantum efficiency. Moreover, a long grinding process does not necessarily lead to a finely divided pulverulent precursor material. By virtue of the pulverulent precursor material being produced in this process described here with reactive reactants, it is already sufficiently finely divided that prolonged grinding processes can be avoided. Therefore, the pulverulent precursor material can be processed to give efficient wavelength conversion layers.

Alternatively, the pulverulent precursor material can be used without further processing as pulverulent conversion material in an optoelectronic component. For this purpose, the pulverulent precursor material can be processed in volume-encapsulated form. The pulverulent precursor material can be embedded here in a matrix material, for example, silicone or other suitable matrix materials. The pulverulent precursor material embedded in matrix material may take the form of an encapsulation, layer or film.

According to at least one embodiment, the wavelength conversion layer takes the form of a platelet, in which case the platelet is disposed directly on a main radiation side of the semiconductor layer sequence. The main radiation side refers here to a face of the semiconductor layer sequence arranged transverse to the growth direction of the semiconductor layer sequence. "Directly" here and hereinafter means that the wavelength conversion layer is in direct mechanical contact with the main radiation side. In this case, no further layers and/or elements are disposed between the wavelength conversion layer and the main radiation side.

According to at least one embodiment, the wavelength conversion layer converts the electromagnetic primary radiation emitted by the semiconductor layer sequence completely to an electromagnetic secondary radiation.

Alternatively, the wavelength conversion layer converts only a portion, for example, 70%, of the electromagnetic primary radiation emitted by the semiconductor layer sequence to an electromagnetic secondary radiation.

According to one embodiment, the wavelength conversion layer is in direct contact with the radiation source. Thus, the conversion of the electromagnetic primary radiation to the electromagnetic secondary radiation can at least partly be effected close to the radiation source, for example, at a distance between the ceramic layer and radiation source of not more than 200 µm, preferably not more than 50 µm (called "chip level conversion").

According to one embodiment, the wavelength conversion layer is spaced apart from the radiation source. Thus, the conversion of the electromagnetic primary radiation to the electromagnetic secondary radiation can be effected at least partly at a great distance from the radiation source, for example, at a distance between the ceramic layer and the radiation source of not less than 200 µm, preferably not less than 750 µm, more preferably not less than 900 µm (called "remote phosphor conversion").

The process described here gives a simple and improved way of producing finely divided pulverulent precursor material, even on the industrial scale.

Here and hereinafter, color data in relation to emitting luminophores or precursor materials refer to the respective spectral region of the electromagnetic radiation.

According to at least one embodiment, the precursor material emits in the red spectral region. The red-emitting precursor material may take the form of a powder or ceramic. The red-emitting precursor material may be disposed in the beam path of an optoelectronic component.

In addition, the optoelectronic component may have a layer that emits in the yellow spectral region. The yellow-emitting layer may take the form of a powder or ceramic. The yellow-emitting layer may be disposed in the beam path of an optoelectronic component. More particularly, it is possible to use yttrium aluminum garnet (YAG) and/or lutetium aluminum garnet (LuAG) in a or as a yellow-emitting layer.

According to at least one embodiment, a red- and yellow-emitting layer is disposed in the beam path of the blue-emitting primary radiation in an optoelectronic component. In this case, the primary radiation is converted only partly by the red- and yellow-emitting layers, such that the overall emission of the optoelectronic component is perceived as warm white light by an outside observer.

According to at least one embodiment, building on the aforementioned embodiments, at least one additional luminophore or an additional precursor material is disposed in the beam path of the optoelectronic component. In principle, the additional luminophore or the additional precursor material may emit any wavelength from the visible spectral region. More particularly, the additional luminophore or the additional precursor material emits in the blue or green spectral region, for example, in the wavelength range from 440 to 520 nm. The overall emission of the optoelectronic component may be perceived as white light by an outside observer.

According to at least one embodiment, the pulverulent precursor material is in powder form and is disposed in an optoelectronic component. The powder is disposed in the beam path of the optoelectronic component having a semiconductor layer sequence.

Specified hereinafter are a comparative example C1 for production of a coarse-grained pulverulent precursor material and inventive examples I1 to I6 for production of finely divided pulverulent precursor materials.

Comparative Example C1: Production of $(Sr_{1-a-b}Ba_bEu_a)_2Si_5N_8$ with $0<a<1$ and $0<b<1$ 99 g of $Sr_3N_2$, 150 g of $Ba_3N_2$, 234 g of $Si_3N_4$ (specific surface area 2.2 m²/g) and 14 g of $Eu_2O_3$ are weighed out under a protective gas atmosphere and homogenized. The reactant mixture is calcined under slight compression under a reducing atmosphere in a tubular or chamber furnace at temperatures between 1500° C. and 1800° C. for several hours. Subsequently, further calcinations are conducted to adjust the particle size or particle size value, likewise under a reducing atmosphere, between 1500° C. and 1800° C. After grinding and sieving of the calcined cake, the result is a coarse-grained luminophore.

Inventive Example I1: Production of $(Sr_{1-a-b}Ba_bEu_a)_2Si_5N_8$ with $0<a<1$ and $0<b<1$ 33 g of $Sr_3N_2$, 155 g of $Ba_3N_2$, 156 g of $Si_3N_4$ (specific surface area about 11 m²/g) and 2 g of $Eu_2O_3$ are weighed out under a protective gas atmosphere and homogenized. The reactant mixture which has been loosened up by sieving is calcined under a reducing atmosphere in a tubular or chamber furnace at temperatures between 1300° C. and 1600° C. for several hours. Subsequently, no more than one second calcination is effected, likewise under a reducing atmosphere at 1300° C. to 1600° C. Between the first and second calcination, the calcined cake is ground, loosened up again by sieving and introduced into a crucible in uncompacted form. After subsequent grinding and sieving of the calcined cake, the result is a monophasic, fine particulate, pulverulent precursor material. The pulverulent precursor material has a first particle size value $d_{10}$ of 0.3 µm, a second particle size value $d_{50}$ of 1.9 µm and a third particle size value $d_{90}$ of 14 µm. This is shown in table 1 below.

Inventive Example I2: Production of $(Sr_{1-a-b}Ba_bEu_a)_2Si_5N_8$ with $0<a<1$ and $0<b<1$ 40 g of $Sr_3N_2$, 147 g of $Ba_3N_2$, 162 g of $Si_3N_4$ (specific surface area about 11 m$^2$/g) and 2 g of $Eu_2O_3$, taking account of the excess of alkaline earth metal cations, are weighed out under a protective gas atmosphere and homogenized. Subsequently, the reactant mixture which has been loosened up by sieving is calcined under a reducing atmosphere in a tubular or chamber furnace at temperatures between 1300° C. and 1600° C. for several hours. Thereafter, a second calcination may be effected, likewise under a reducing atmosphere at 1300° C. to 1600° C. Between the calcinations, the calcined cake is ground and loosened up again by sieving and introduced into a crucible in uncompacted form. After subsequent grinding and sieving of the calcined cake, the result is a fine particulate, pulverulent precursor material having a first and second phase. The second phase having the composition $(Sr_{1-y}Ba_x)Si_7N_{10}$ with $0 \leq x \leq 1$ and $0 \leq y \leq 1$, especially $BaSi_7N_{10}$, is present in the pulverulent precursor material in a proportion of 5%. The particle size values are apparent from table 1.

Inventive Example I3: Production of $(Sr_{1-a-b}Ba_bEu_a)_2Si_5N_8$ with $0<a<1$ and $0<b<1$ 49 g of $Sr_3N_2$, 226 g of $Ba_3N_2$, 234 g of $Si_3N_4$ (specific surface area about 110 m$^2$/g) and 3 g of $Eu_2O_3$ are weighed out under a protective gas atmosphere and homogenized. Subsequently, the reactant mixture is calcined under a reducing atmosphere in a tubular or chamber furnace at temperatures between 1300° C. and 1600° C. for several hours. A maximum of one second calcination is effected, likewise under a reducing atmosphere at 1300° C. to 1600° C. Between the first and second calcinations, the calcined cake is ground and loosened up again by sieving. After subsequent grinding and sieving of the calcined cake, the result is a fine particulate, pulverulent precursor material having a first and second phase, the second phase having the composition $(Sr_{1-y}Ba_x)Si_7N_{10}$ with $0 \leq x \leq 1$ and $0 \leq y \leq 1$, especially $BaSi_7N_{10}$.

Inventive Example I4: Production of $(Sr_{1-a-b}Ca_bEu_a)_2Si_5N_8$ with $0<a<1$ and $0<b<1$ 66 g of $Sr_3N_2$, 34 g of $Ca_3N_2$, 156 g of $Si_3N_4$ (specific surface area about 11 m$^2$/g) and 1 g of $Eu_2O_3$ are weighed out under a protective gas atmosphere and homogenized. The reactant mixture in loose and uncompacted form is introduced into a crucible and calcined under a reducing atmosphere in a tubular or chamber furnace at temperatures between 1200° C. and 1500° C. for 30 to 300 minutes. No further calcination is effected, since the product is already in single-phase and finely divided form. After subsequent grinding and sieving of the calcined cake, the result is a fine particulate, pulverulent precursor material. The pulverulent precursor material has a first particle size value $d_{10}$ of 0.3 µm, a second particle size value $d_{50}$ of 1 µm and a third particle size value $d_{90}$ of 2.4 µm.

Inventive Example I5: Production of $(Ca_{1-a-b-c}Sr_cBa_bEu_a)_2Si_5N_8$ with $0<a<1$ and $0<b<1$ and $0<c<1$ 5 g of $Ca_3N_2$, 81 g of $Sr_3N_2$, 122 g of $Ba_3N_2$, 210 g of $Si_3N_4$ (specific surface area about 11 m$^2$/g) and 3 g of $Eu_2O_3$ are weighed out under a protective gas atmosphere and homogenized. Subsequently, the reactant mixture in loose and uncompacted form is introduced into a crucible and calcined under a reducing atmosphere in a tubular or chamber furnace at temperatures between 1300° C. and 1600° C. for several hours. A second calcination may be effected, likewise under a reducing atmosphere between 1300° C. and 1600° C. Between the calcinations, the calcined cake is ground, loosened up by sieving and introduced in uncompacted form into a crucible. After subsequent grinding and sieving of the calcined cake, the result is a fine particulate, pulverulent precursor material which comprises or consists of a first phase.

Inventive Example I6: Production of $(Sr_{1-a}Eu_a)_2Si_5N_8$ with $0<a<1$ 194 g of $Sr_3N_2$, 234 g of $Si_3N_4$ (specific surface area about 11 m$^2$/g) and 3 g of $Eu_2O_3$ are weighed out under a protective gas atmosphere and homogenized. The reactant mixture in slightly compacted form is introduced into a crucible and calcined under a reducing atmosphere in a tubular or chamber furnace at temperatures between 1200° C. and 1600° C. for several hours. Subsequently, further calcinations may be effected, likewise under a reducing atmosphere between 1200° C. and 1600° C. Between the calcinations, the calcined cake is introduced in ground and slightly compacted form into a crucible. After subsequent grinding and sieving of the calcined cake, the result is a fine particulate, pulverulent precursor material.

In inventive examples I1 to I6, the silicon nitride used as reactant was used in a proportion of greater or equal than 90% in the alpha-silicon nitride polymorph or in the form of amorphous silicon nitride.

Table 1 below shows the specific surface area O of $Si_3N_4$ in m$^2$/g, the first particle size value $d_{10}$ in µm, the second particle size value $d_{50}$ in µm and the third particle size value $d_{90}$ in µm. In addition, Table 1 states which alkaline earth metal cations in the first phase are present.

| | Alkaline earth metal cations | O in m$^2$/g | $d_{10}$ in µm | $d_{50}$ in µm | $d_{90}$ in µm |
|---|---|---|---|---|---|
| C1 | Sr—Ba | 2.2 | 3.6 | 9.5 | 16.8 |
| I1 | Sr—Ba | 11 | 0.3 | 1.9 | 14.0 |
| I2 | Sr—Ba | 11 | 0.4 | 1.9 | 14.9 |
| I3 | Sr—Ba | 110 | 0.2 | 0.9 | 6.6 |
| I4 | Sr—Ca | 11 | 0.3 | 1.0 | 2.4 |
| I5 | Sr—Ba—Ca | 11 | 0.2 | 0.9 | 3.9 |
| I6 | Sr | 11 | 0.3 | 2.0 | 6.7 |

It was shown that, by virtue of the high specific surface area of the nitrides as reactants, for example, of silicon nitride, and the use of alpha-silicon nitride or amorphous silicon nitride as reactant, it is possible to selectively produce a finely divided pulverulent precursor material in which the sintering properties and the surface area can be controlled.

It is thus possible to affect not only the particle size but also the packing density, for example, in the case of processing by means of tape casting. If the proportion of alpha-silicon nitride is greater or equal than 90% of the silicon nitride used or the silicon nitride is amorphous and has a specific surface area of greater or equal than 9 m²/g, it is possible to produce pulverulent precursor materials having very small particle size values.

Figure 1:
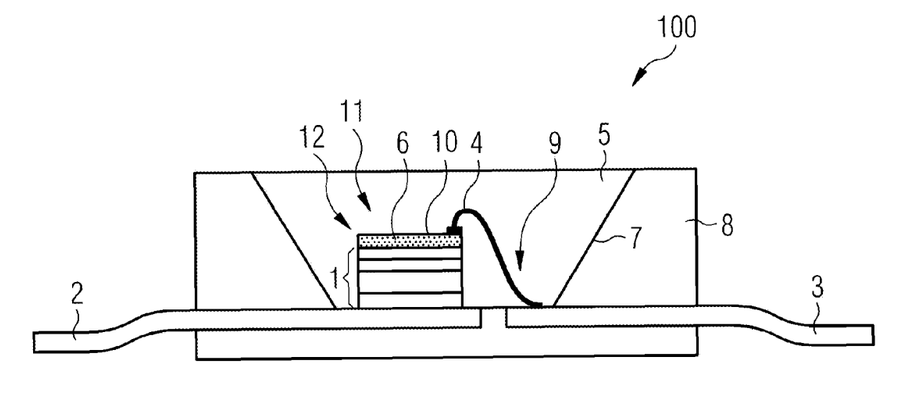
The sole FIGURE shows a schematic side view of an optoelectronic component according to one embodiment.

The FIGURE shows a schematic side view of an optoelectronic component 100 using the working example of a light-emitting diode (LED). The optoelectronic component 100 has a layer sequence 1 with an active region (not shown explicitly), a first electrical connection 2, a second electrical connection 3, a bonding wire 4, an encapsulation 5, a housing wall 7, a housing 8, a recess 9, a precursor material 6 for formation of a ceramic layer 11 or wavelength conversion layer 12 and a matrix material 10. The layer sequence 1 having an active region comprising the wavelength conversion layer 12 is disposed within the optoelectronic component 100, the encapsulation 5 and/or the recess 9. The first and second electrical connections 2, 3 are disposed beneath the layer sequence 1 having an active region. There is indirect and/or direct electrical and/or mechanical contact between the layer sequence 1 having an active region and the bonding wire 4, and between the layer sequence 1 having an active region and the first and/or second electrical connection 2, 3.

In addition, the layer sequence 1 having an active region may be disposed on a carrier (not shown here). A carrier may, for example, be a printed circuit board (PCB), a ceramic substrate, another circuit board or a metal sheet, for example, aluminum sheet.

Alternatively, a carrier-free arrangement of the layer sequence 1 is possible in the case of what are called thin-film chips.

The active region is suitable for emission of electromagnetic primary radiation in an emission direction. The layer sequence 1 having an active region may be based, for example, on nitride compound semiconductor material. Nitride compound semiconductor material emits particularly electromagnetic primary radiation in the blue and/or ultraviolet spectral region. More particularly, InGaN can be used as nitride compound semiconductor material having electromagnetic primary radiation having a wavelength of 460 nm.

The wavelength conversion layer 12 is disposed in the beam path of the electromagnetic primary radiation. The matrix material 10 is, for example, polymeric or ceramic material. In this case, the wavelength conversion layer 12 is disposed in direct mechanical and/or electrical contact on the layer sequence 1 having an active region.

Alternatively, further layers and materials, for example, the encapsulation, may be disposed between the wavelength conversion layer 12 and the layer sequence 1 (not shown here).

Alternatively, the wavelength conversion layer 12 may be disposed indirectly or directly on the housing wall 7 of a housing 8 (not shown here).

Alternatively, it is possible that the precursor material is embedded in a potting compound (not shown here) and takes the form of an encapsulation 5 together with the matrix material 10.

The wavelength conversion layer 12 at least partly converts the electromagnetic primary radiation to an electromagnetic secondary radiation. For example, the electromagnetic primary radiation is emitted in the blue spectral region of the electromagnetic radiation, with conversion of at least some of this electromagnetic primary radiation by the wavelength conversion layer 12 to an electromagnetic secondary radiation in the red and/or green spectral region and/or combinations thereof. The total radiation emitted from the optoelectronic component is a superimposition of blue-emitting primary radiation and red- and green-emitting secondary radiation, the total emission visible to the outside observer being white light.

The invention is not restricted by the description with reference to the working examples; instead, the invention encompasses every new feature and every combination of features, which especially includes every combination of features in the claims, even if this feature or this combination itself is not specified explicitly in the claims or working examples.

The invention claimed is:

1. A process for producing a pulverulent precursor material for an optoelectronic component having a first phase of the following general composition:

$$(Ca_{1-a-b-c-d-e}Zn_dMg_eSr_cBa_bX_a)_2Si_5N_8,$$

wherein X is an activator selected from the group of the lanthanoids, and wherein $0<a<1$ and $0\leq b\leq 1$ and $0\leq c\leq 1$ and $0\leq d\leq 1$ and $0\leq e\leq 1$, the process comprising:
producing a pulverulent mixture of reactants, wherein the reactants comprise ions of the abovementioned composition, wherein at least silicon nitride having a specific surface area of greater or equal than 9 m²/g is selected as reactant, and wherein the silicon nitride comprises alpha-silicon nitride or is amorphous; and
calcining the mixture under a protective gas atmosphere.

2. The process according to claim 1, wherein the pulverulent precursor material has particles with different particle sizes, wherein the pulverulent precursor material has a particle with a particle size less than 1 μm, wherein the pulverulent precursor material has a particle with a particle size less than 5 μm, and wherein the pulverulent precursor material has a particle with a particle size less than 20 μm.

3. The process according to claim 1, wherein the silicon nitride used as reactant is used in the form of alpha-silicon nitride in a proportion of greater or equal than 90%.

4. The process according to claim 1, wherein the silicon nitride has a specific surface area between 9 m²/g and 150 m²/g.

5. The process according to claim 1, wherein the calcining is conducted at a temperature between 1200° C. and 1700° C.

6. The process according to claim 1, wherein the mixture of reactants used in the producing step comprise reactants selected from the group consisting of carbonates, oxides, nitrides, carbides, metals halides and combinations thereof.

7. The process according to claim 1, wherein the calcining step is conducted one to five times.

8. The process according to claim 7, wherein the mixture is ground or loosened up or sieved between individual calcining steps or before the calcining.

9. The process according to claim 1, wherein the calcining step includes a hold time between 1 minute and 24 hours.

10. The process according to claim 1, wherein alkaline earth metal cations present in the first phase in the producing step, based on the total proportion of all cations in the first phase, are added in an excess of less or equal than 1 mol %, wherein a second phase is produced in addition to the first phase during or after the calcining step, and wherein the second phase has the following general composition:

$$(Ca_{1-x-y}Sr_yBa_x)Si_7N_{10},$$

where $0\leq x\leq 1$ and $0\leq y\leq 1$.

11. The process according to claim 1, wherein alkaline earth metal cations are added as ions in the producing step, based on a composition of the first phase, in a stoichiometric proportion or in an excess of greater or equal than 1 mol %, based on the total proportion of all the cations in the first phase, and wherein the first phase is obtained exclusively during or after the calcining step.

12. A pulverulent precursor material produced by the process according to claim 11.

13. A pulverulent precursor material having a first particle size value $d_{10}$, a second particle size value $d_{50}$ or a third particle size value $d_{90}$, wherein the first particle size value $d_{10}$ is less than 1 μm, wherein the second particle size value $d_{50}$ is less than 5 μm, and wherein the third particle size value $d_{90}$ is less than 20 μm.

14. The pulverulent precursor material according to claim 13, wherein the pulverulent precursor material forms a ceramic layer of an optoelectronic component having a semiconductor layer sequence, wherein the ceramic layer is located in a beam path of the optoelectronic component.

15. The pulverulent precursor material according to claim 14, wherein the pulverulent precursor material comprises a first phase and a second phase, wherein the second phase serves as sintering aid for formation of the ceramic layer.

16. The pulverulent precursor material according to claim 14, wherein the ceramic layer is used as wavelength conversion layer.

17. The pulverulent precursor material according to claim 16, wherein the wavelength conversion layer takes the form of a platelet, wherein the platelet is disposed directly on a main radiation side of the semiconductor layer sequence.

18. The pulverulent precursor material according to claim 14, wherein an additional luminophore or an additional precursor material or an additional luminophore ceramic is disposed in the beam path of the optoelectronic component for generation of white light.

19. The pulverulent precursor material according to claim 14, wherein the pulverulent precursor material takes the form of a powder, wherein the powder is disposed in the beam path of the optoelectronic component having a semiconductor layer sequence.

* * * * *